United States Patent
Schnaitter et al.

(10) Patent No.: US 10,256,809 B2
(45) Date of Patent: Apr. 9, 2019

(54) POWER-ON RESET CIRCUIT

(71) Applicant: Ruizhang Technology Limited Company, Shanghaiot (CN)

(72) Inventors: William Schnaitter, San Ramon, CA (US); Steve Wang, San Jose, CA (US)

(73) Assignee: RUIZHANG TECHNOLOGY LIMITED COMPANY, Shanghai (CN)

( * ) Notice: Subject to any disclaimer, the term of this patent is extended or adjusted under 35 U.S.C. 154(b) by 0 days.

(21) Appl. No.: 15/345,200

(22) Filed: Nov. 7, 2016

(65) Prior Publication Data

US 2018/0131367 A1     May 10, 2018
US 2018/0375511 A9     Dec. 27, 2018

Related U.S. Application Data

(63) Continuation of application No. 14/845,246, filed on Sep. 3, 2015, now Pat. No. 9,515,637.

(30) Foreign Application Priority Data

Aug. 24, 2015    (CN) .......................... 2015 1 0523813

(51) Int. Cl.
*H03L 7/00*     (2006.01)
*H03K 17/22*     (2006.01)
*H03K 5/24*     (2006.01)
*G05F 3/24*     (2006.01)

(52) U.S. Cl.
CPC ............. *H03K 17/223* (2013.01); *G05F 3/24* (2013.01); *H03K 5/2472* (2013.01)

(58) Field of Classification Search
None
See application file for complete search history.

(56) References Cited

U.S. PATENT DOCUMENTS

| | | | |
|---|---|---|---|
| 5,369,310 A | 11/1994 | Badyal et al. | |
| 6,924,709 B2 * | 8/2005 | Bashar | H03K 3/011 331/143 |
| 7,675,331 B2 | 3/2010 | Jung | |
| 9,515,637 B1 * | 12/2016 | Schnaitter | H03K 5/24 |

FOREIGN PATENT DOCUMENTS

| | | | |
|---|---|---|---|
| EP | 1 986 323 A2 | 10/2008 | |
| EP | 1 986 323 A3 | 12/2008 | |

OTHER PUBLICATIONS

European Search Report for European Patent Application No. 16001858.6 dated Nov. 16, 2016.

* cited by examiner

*Primary Examiner* — Long Nguyen
(74) *Attorney, Agent, or Firm* — Womble Bond Dickinson (US) LLP

(57) ABSTRACT

A Power-on Reset circuit is described. The Power-on Reset is formed by two comparators and a latch circuit. The Power-on Reset circuit will de-assert the reset state once the supply voltage reaches a first reference point and re-assert the reset state once the supply voltage drops below a second reference point. The Power-on Reset circuit disclosed further includes circuits to initialize properly and to ensure the regulator voltage and the bandgap voltages are stable and above the ground level voltage.

20 Claims, 8 Drawing Sheets

POWER-ON RESET CIRCUIT

This application is a continuation of co-pending U.S. patent application Ser. No. 14/845,246 filed on Sep. 3, 2015, which claims priority under 35 U.S.C. § 119 to Chinese Patent Application No. 201510523813.3 filed on Aug. 24, 2015.

FIELD OF THE TECHNOLOGY

The present invention relates to the field of integrated circuits; more particularly, the present invention relates to circuitry for power-on reset circuits.

BACKGROUND OF THE INVENTION

In many electronic systems, some critical components of the system such as voltage references, and regulated voltages and currents, may require some time to stabilize. To avoid improper functioning of these systems, these components must stabilize to a known power state before beginning the normal operation. Power-on Reset (POR) circuits are typically used to initialize stable power states, ensuring that booting is accomplished safely. POR circuits force the system into a reset state upon power supply activation and maintain the system in that state until power is stabilized, as indicated by a parameter such as a voltage reference. It is typically also of value to de-assert the reset condition as early as is safe to do so.

Many different electronic designs have been attempted to improve the performance of the POR circuits. However, significant improvements are still needed in the following areas of POR performance: detecting stable operation of various system components which could power-up in a variety of ways depending upon process and temperature variations and upon varying power-up ramp times of the supply, recognizing false appearance of requirements for de-assertion of reset, and avoiding excess time beyond the necessary conditions to improve system performance.

BRIEF DESCRIPTION OF THE DRAWINGS

The present invention is illustrated by way of example and not limitation in the figures of the accompanying drawings in which like references indicate similar elements.

DETAILED DESCRIPTION

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term "substantially" herein refers to being within 10% of the target.

For purposes of the embodiments described herein, unless otherwise specified, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, etc., may be used without departing from the scope of the disclosure.

Figure 1:
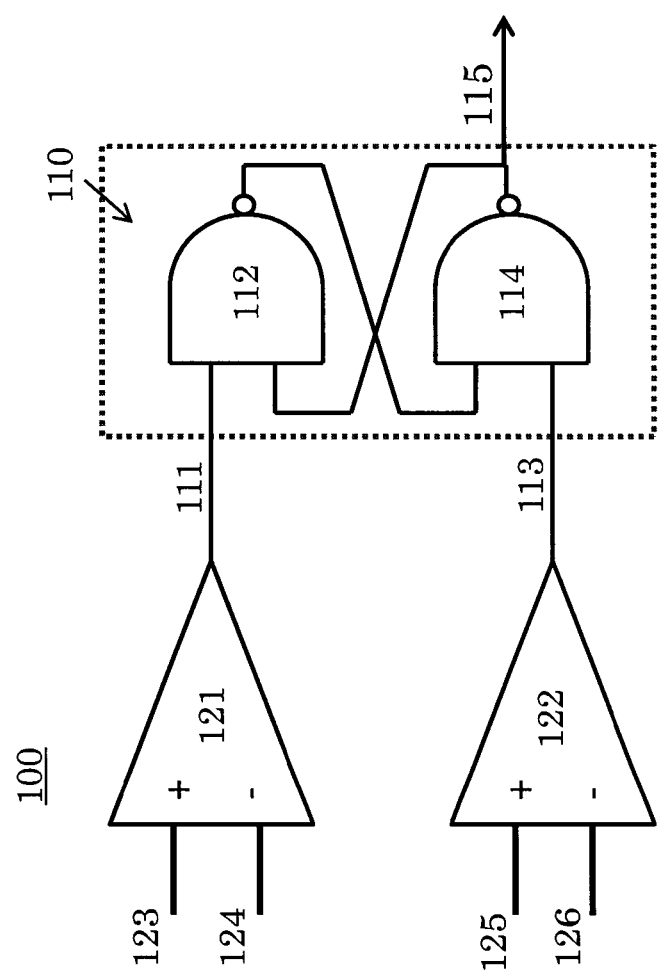
FIG. 1 illustrates a circuit diagram of a power-on reset circuit according to an embodiment of the invention.

FIG. 1 illustrates a schematic of an exemplary POR circuit 100, in accordance with embodiments of the present invention. The POR circuit 100 comprises of a latch circuit 110, and two comparators 121 and 122.

Referring to FIG. 1, the POR circuit 100 comprises the comparators 121 and 122. In an embodiment, the comparators 121 and 122 are op-amp (operational amplifier), each having an inverting terminal and a non-inverting terminal. The output of the comparators 121 and 122 are coupled to the latch circuit 110.

According to an embodiment of the invention, the non-inverting terminal of the comparator 121 receives a first reference voltage 123 and the inverting terminal of the comparator 121 receives a supply voltage 124. In another embodiment, the inverting terminal of the comparator 121 receives a voltage proportional to the supply voltage. In an embodiment, the non-inverting terminal of comparator 122 receives the supply voltage 125 and the inverting terminal of comparator 122 receives a second reference voltage 126. In one embodiment, the non-inverting terminal of the comparator 121 receives a voltage proportional to the supply voltage.

In an embodiment of the invention, the reference voltages 123 and 126 are proportional to a regulator voltage. Any appropriate technique in the art may be used to configure the regulator voltage to produce proportional reference voltages 123 and 126. In one embodiment, the regulator voltage is generated by a voltage regulator circuit based on a bandgap voltage $V_{BG}$. As defined herein, the bandgap voltage $V_{BG}$ is a constant voltage irrespective of power supply variations, temperature changes and the loading on the device. Generating reference voltages 123 and 126 based on the regulator voltage and the bandgap voltage $V_{BG}$ can be performed by any known methods in the art. In an embodiment, the first reference voltage is greater than the second reference voltage. For example, in case of using POR circuit 100 in radio frequency identification (RFID) systems $V_{BG}$ is 0.365 V, while the first reference voltage is three times the $V_{BG}$ (1.095 V) and the second reference voltage is two times $V_{BG}$ (0.73 V).

In an alternative embodiment, the reference voltages 123 and 126 may have the same voltage; however, the comparators 121 and 122 compare the reference voltages to a voltage proportionate to the supply voltage. For example, in case of using POR circuit 100 in RFID systems, the reference voltages 123 and 126 may have a same voltage of 0.73 V (double the $V_{BG}$ of 0.365 V), however, the comparator 121 receives a voltage equivalent to two third of the supply voltage and the comparator 122 receives the supply voltage. Any appropriate techniques in the art may be used to generate a voltage proportionate to the supply voltage.

In an embodiment of the invention, voltage dividers may be used to generate an appropriate ratio of the supply voltage and the regulator voltage to the comparators 121 and 122. In an embodiment, voltage dividers may be formed by series connected resistors. In an alternative embodiment, diode-connected pMos transistors may be used instead of resistors by any known method in the art. The diode-connected pMos transistors provide a lower current through the voltage dividers while accommodating scaling of the device to a smaller size.

Referring to FIG. 1, the POR circuit 100 comprises a latch circuit 110. In an embodiment, the latch circuit 110 is an SR flip-flop formed by two cross-coupled NAND gates 112 and 114. The NAND gate 112 receives a de-assert signal 111 from the comparator 121. The NAND gate 114 receives a re-assert signal 113 from the comparator 122. The output of latch 110 is a POR signal 115. The POR signal 115 either de-asserts the reset state or re-asserts the reset state. A low POR signal 115 de-asserts the reset state. To generate a low POR signal 115, a low de-assert signal 111 and a high re-assert signal 113 is required as inputs to the latch circuit 110. On the other hand, a high POR signal 115 re-asserts the reset state. To generate a high POR signal 115, a high de-assert signal 111 and a low re-assert signal 113 is required as inputs to the latch circuit 110.

In an embodiment of the invention, the POR circuit 100 must begin in an asserting state. Therefore, initially the de-assert signal 111 is at a high state and the re-assert signal 113 is at a low state, resulting in POR signal 115 to be high. Subsequently, as the power-up process progresses, the re-assert signal 113 can be restored to a high state, with the latch 110 output of the POR signal 115 retaining a high state. As the system powers up, the POR circuit 100 must de-assert the reset state when the supply voltage reaches a safe startup voltage and other conditions are met to ensure safe chip operation. In an embodiment, the comparator 121 compares the supply voltage 124 with the first reference voltage 123. When the supply voltage 124 exceeds the first reference voltage 123, the de-assert signal 111 switches from a high state to a low state. Therefore, the Latch 110 receives a low de-assert signal 111 and a high re-assert signal 113, generating a low POR signal 115. As such, the POR circuit 100 de-asserts the reset state once the supply voltage reaches a safe threshold. In case of using POR circuit 100 in a RFID system, for example, the first reference voltage 123 may be set to three times the $V_{BG}$ (0.365 V) at 1.095 V. Therefore, once the startup voltage reaches 1.095V, the POR circuit 100 de-asserts the reset state. On the other hand, the second reference voltage 126 may be set to two times the $V_{BG}$ (0.365 V) at 0.73 V. Therefore, if the voltage reaches above 1.095 V it will definitely not be below 0.73 V and the comparator 122 generates a high re-assert signal 113. Receiving a low de-assert signal 111 and a high re-assert signal 113, the latch circuit 110 generates a low POR signal 115. A low POR signal 115 de-asserts the reset state. The reset state will remain de-asserted until POR circuit 100 re-asserts the reset state.

In an embodiment, the first reference voltage 123 must be set to a threshold level that avoids reset cycling of the POR circuit 100. Reset cycling occurs when the device goes through a reset sequence, and the same or related reset event occurs again, thereby causing a new reset sequence to start. In a RFID system, setting the first reference voltage 123 to be three times the $V_{BG}$ will prevent occurrence of reset cycling.

In an embodiment of the invention, once the supply voltage drops below a threshold voltage, the system begins to malfunction. Therefore, it is desirable to re-assert the reset state when the supply voltage falls below a second threshold level. In an embodiment, the comparator 122 compares the supply voltage 125 to the second reference voltage 126. In an embodiment, once the supply voltage 125 falls below the second reference voltage 126, the comparator 122 generates a low re-assert signal 113. Since the second reference voltage 126 is lower than the first reference voltage 123, the comparator 121 generates a high de-assert signal 111. Subsequently, the latch 110 generates a high POR signal 115 to re-assert the reset state. In case of using POR circuit 100 in a RFID system, for example, the second reference voltage 126 may be set to two times the $V_{BG}$ (0.365 V) at 0.73 V. Therefore, once sufficient RF power is lost and supply voltage falls below 0.73V, the comparator 122 generates a low re-assert signal 113. On the other hand, the first reference voltage 123 may be set to three times the $V_{BG}$ (0.365 V) at 1.095 V. Therefore, if the supply voltage falls below 0.73V it will definitely fall below 1.095 V and the comparator 121 generates a high de-assert signal 111. Receiving a high de-assert signal 111 and a low re-assert signal 113, the latch circuit 110 generates a high POR signal 115. A high POR signal 115 re-asserts the reset state. The reset state will remain asserted until POR circuit 100 de-asserts the reset state as described above.

Figure 2:
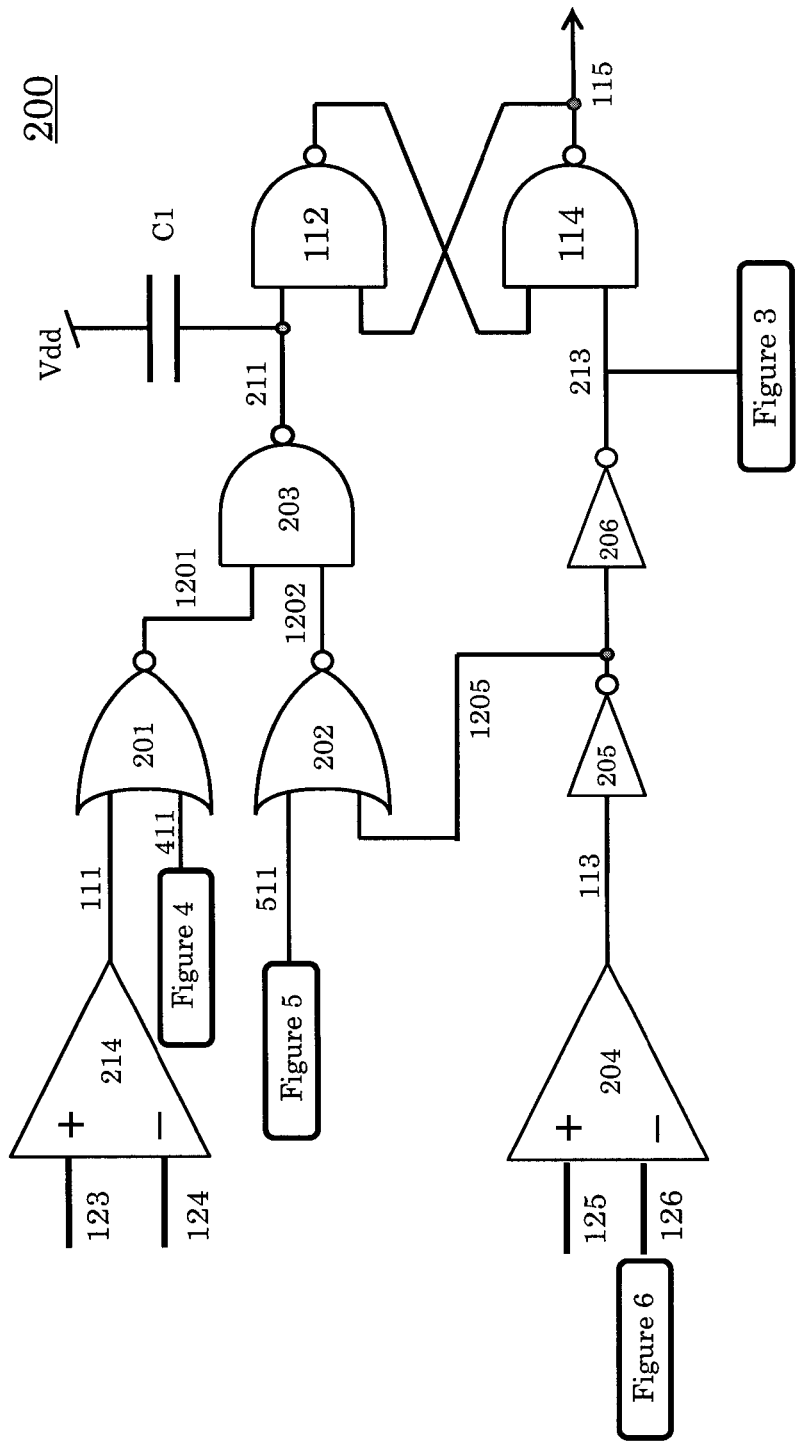
FIG. 2 illustrates a more detailed circuit diagram of a power-on reset circuit according to an embodiment of the invention.

FIG. 2 illustrates a more detailed schematic of an exemplary POR circuit 200, in accordance with embodiments of the present invention. It will be appreciated that for simplicity and/or clarity of illustration, some elements of the invention are described in other figures as referenced in FIG. 2.

In an embodiment of the invention, the POR circuit 200 must begin in an asserting state until the conditions are met for the de-assertion of the reset signal. In order to maintain an asserting state, a de-assert1 signal 211 to the NAND gate 112 must be at a high state while a re-assert1 signal 213 to the NAND gate 114 must begin low. The re-assert signal 213 will transition to a high state as the system powers up. In an embodiment, a capacitor C1 is placed between the supply voltage $V_{dd}$ and the de-assert1 signal 211. As such, during the system power up, the voltage of the de-assert1 signal 211 follows the $V_{dd}$ voltage as the capacitor C1 charges up. On the other hand, to maintain the voltage of the re-assert1 signal 213 at a low state initially as the system powers up, the circuit in FIG. 3 may be used.

In an embodiment of the invention, voltage regulators may use $V_{BG}$, to generate the reference voltages 123 and 126. However, some bandgap circuits and voltage regulators behave somewhat erratically during power-up with very different behaviors under different startup conditions and power-up rates. The POR circuit 200 must ensure to block de-assertion of the reset state until voltages of regulators and bandgap are stabilized. As further described below, the circuit in FIG. 4 may be used to determine whether the stabilization point has been reached. As further explained blow, to block the de-assertion, the circuit of FIG. 4 generates a high blocking signal 411.

In an embodiment of the invention, the POR circuit 200 must also block de-assertion if the reference voltages 123 and 126 are too low. The bandgap voltage may take some time to rise and consequently the reference voltages 123 and 126 may be at a ground level initially. While the circuit of FIG. 4 blocked a de-assertion of the reset state before the regulator voltages $V_{REG}$ are stabilize, the circuit of FIG. 5 ensures to block premature de-assertion when the reference voltages are too low. As further explained below, to block the de-assertion, the circuit of FIG. 5 generates a high blocking signal 511.

In an embodiment of the invention, in order to re-assert the reset state once the supply voltage 125 falls below the second reference voltage 126, the de-assert1 signal 211 must be at a high state. In an embodiment, logic gates may be used to ensure the de-assert1 signal 211 is at a high state when the re-assert1 signal is at a low state. Referring to FIG. 2, a NOR gate 202 in combination with a NAND gate 203 may be used. In an embodiment, the NOR gate 202 receives the output signal 1205 of the inverter 205 and the blocking signal 511. The output signal 1202 of the NOR gate 202 is inputted to the NAND gate 203.

In an embodiment, upon the determination by the comparator 204 that the supply voltage 125 has fallen below the threshold voltage, the signal 113 goes to a low state. The NOR gate 202 receives a high signal 1205 through the inverter 205. Subsequently, irrespective of the state of the signal 511, the output signal 1202 of the NOR gate 202 will be low. Because of the low state of the output signal 1202 to the NAND gate 203, the de-assert1 signal 211 will be high regardless of the state of the signal 1201.

Figure 4:
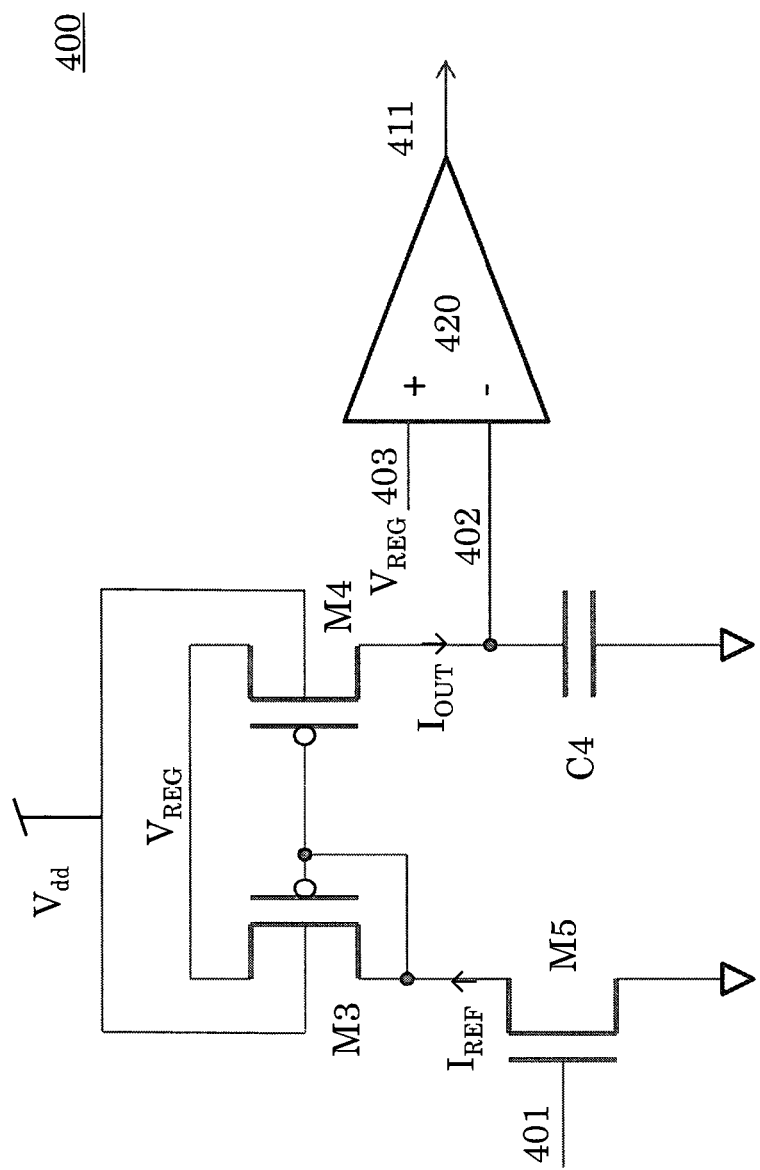
FIG. 4 illustrates a circuit that ensures the regulator voltage is stabilized before allowing for the de-assertion of the reset state according to one embodiment of the present invention.
Figure 5:
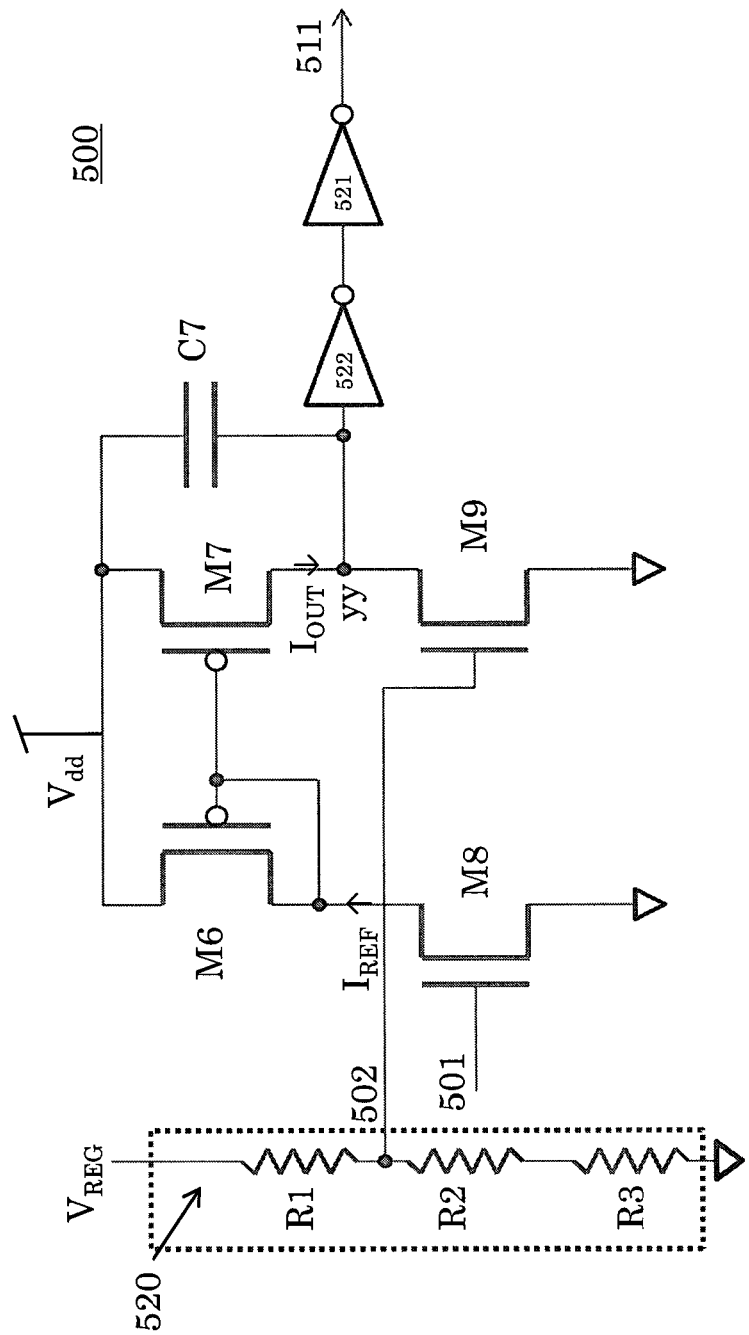
FIG. 5 illustrates a circuit that ensures the regulator voltage is above the ground level before allowing for the de-assertion of the reset state according to one embodiment of the present invention.

In an embodiment, logic gates may be used to block the de-assertion based on the signal generated by the circuits of FIG. 4 and FIG. 5. In an embodiment, the NOR gate 201 receives the blocking signal 411 and the de-assert signal 111. The NOR gate 202 receives the blocking signal 511 and the signal 1205. The output 1201 of the NOR gate 201 and the output 1202 of the NOR gate 202 are inputted to the NAND gate 203. To de-assert the reset state, the de-assert1 signal 211 of the NAND gate 203 must be low. The de-assert1 signal 211 will be low only when both signals 1201 and 1202 to the NAND gate 203 are high. Furthermore, the output signals 1201 and 1202 of the NOR gates 201 and 202 are high if all input signals 111, 411, 511, and 1205 are at a low state. Therefore, as explained above, the circuit of FIG. 4 and the circuit of FIG. 5 can block de-assertion of the reset state by generating high blocking signals 411 and 511.

In an embodiment of the invention, the comparator 204 compares the supply voltage 125 to the second reference voltage 126 to ensure re-assertion of the reset state once the supply voltage falls below a threshold level. However, since the reference voltage 126 is based on the $V_{BG}$, and $V_{BG}$ drops as the supply voltage 125 falls, the re-assertion may be never be initialized. The circuit of FIG. 6 generates a stored version of the reference voltage 126. The time for which the stored version is held is sufficient for the comparator 122 to recognize the supply voltage is dropping below a threshold level to re-assert the reset state.

In an embodiment of the invention, the bandgap circuit may use a control voltage to generate a regulated current. This control voltage can be used with techniques such as current mirroring to generate multiple temperature independent currents for use in circuits other than the bandgap circuit. The control voltage is initially at zero but it increases as the system powers up. In one embodiment, the control voltage of the bandgap circuit described in a related US patent application Ser. No. 14/845,244 entitled "Fractional Bandgap With Low Supply Voltage and Low Current" by Inventors William Schnaitter and Steve Wang filed Sep. 3, 2015 is used in this invention. In other embodiments, a control voltage may be any generally stable voltage that can be used with a circuit to provide stable operation of the circuit, such as a POR circuit, and this generally stable voltage can be used to generate a regulated current.

Figure 3:
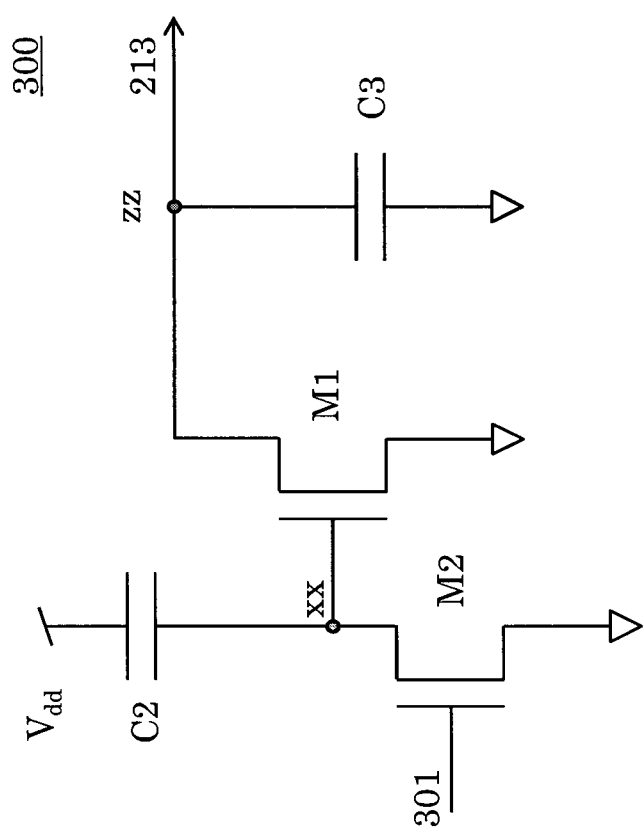
FIG. 3 illustrates a startup circuit that ensures POR circuit is initially in an asserting state according to one embodiment of the present invention.

Referring to FIG. 3, the circuit 300 ensures that the POR circuit 200 of FIG. 2 is in an asserting state by setting the voltage of the re-assert1 signal 213 at a low state as the system powers up. The circuit 300 comprises of a capacitor C2 coupled to a voltage source $V_{dd}$ and a drain of a transistor M2 at a node XX. A gate of the transistor M2 is coupled to a control voltage 301. A source of the transistor M2 is coupled to the ground. The circuit 300 also comprises of another transistor M1, having its drain coupled to a node ZZ, a gate connected to the node XX, and a source coupled to the ground. A capacitor C3 is coupled in parallel with the transistor M1, having one terminal connected to the node ZZ and the other terminal grounded. In an embodiment of the invention, the node ZZ is coupled to the re-assert1 signal 213, between the inverter 206 and the comparator 114 as illustrated in FIG. 2. In an embodiment, the transistor M1 and M2 are N-type Metal Oxide Semiconductor (NMOS) transistors.

Referring back to FIG. 3, the capacitor C2 begins charging by the voltage source $V_{dd}$ during the system startup. The voltage at the node XX initially follows $V_{dd}$. Thus, as $V_{dd}$ rises, the transistor M1 will begin to conduct. As such, the transistor M1 pulls the voltage of the node ZZ to the ground level. Consequently, the re-assert1 signal 213 inputs a low state to the latch 110 of FIG. 2. As explained above, a low re-assert1 signal 213 results in a high PoR signal 115 and asserting the reset state.

In an embodiment of the invention, as the system powers up, the bandgap voltage increases from a ground level to a constant threshold. In one embodiment, the signal 301 is the control voltage to generate a regulated current, used in the bandgap circuit. The control voltage is initially at zero but it increases as the system powers up. As the bandgap starts to operate, the control signal 301 will rise to turn on the M2 transistor. The M2 transistor pulls the voltage at the XX node to the ground level and the transistor M1 will stop conducting any further. Consequently, the state of the re-assert1 signal 213 is dictated by the output of the inverter 206 in FIG. 2.

Referring to FIG. 4, the circuit 400 ensures to block the de-assertion of the reset state until the regulator voltage $V_{REG}$ and the bandgap voltage are stabilized. In an embodiment of the invention, the circuit 400 comprises of three transistors M3, M4, and M5, a capacitor C4, and a comparator 420. In an embodiment, the transistor M3 and M4 are P-type Metal Oxide Semiconductor (PMOS) transistors. In an embodiment, the transistors M3 and M4 form a current mirror in the following configuration: gates of the transistors M3 and M4 are coupled together, sources of the transistors M3 and M4 are coupled to a regulator voltage $V_{REG}$, and the M3 transistor will be forced to sustain a current dictated by M5 and node 401. In an embodiment, the transistor M3 is matched to the transistor M4, that is, the PMOS transistors have the same characteristics. As a result of the gate coupling and matched transistor characteristics, the $V_{GS}$ (Gate-Source Voltage) of the transistor M3 is set to the $V_{GS}$ of the transistor M4, and consequently, a current $I_{REF}$ flowing in the drain of the transistor M3 is the same as the current $T_{OUT}$ flowing in the drain of the transistor M4. In an embodiment, the bulk terminal of the transistors M3 and M4 is coupled to the supply voltage $V_{dd}$.

Referring to FIG. 4, the drain of the transistor M3 is also coupled to the drain of transistor M5. The current in transistor M5 is controlled by a control voltage 401. A control voltage is used generate a regulated current in the bandgap circuit. The control voltage is initially at zero but it increases as the system powers up. In an embodiment, the transistor M5 is a NMOS transistor. In an embodiment of the invention, the drain of the transistor M4 is coupled to the capacitor C4. The other terminal of the capacitor C4 is grounded. In an embodiment, a delayed replica of the regulator voltage $V_{REG}$ is generated at a terminal 402 connecting the capacitor C4 to the drain of the transistor M4 and to the inverting terminal of the comparator 420. A non-inverting terminal of the comparator 420 is coupled to a regulator voltage 403. In an embodiment, the comparator 420 is an Operational Amplifier (OP AMP). The comparator 420 generates a blocking signal 411.

Referring to FIG. 4, initially the control voltage 401 is near the ground level. As the system powers up and the supply voltage $V_{dd}$ rises, the control voltage 401 from the bandgap circuit and the regulator voltage 403 will also increase. However, as it will be further discussed below, the delayed regulator voltage 402 will initially remain low. Subsequently, the comparator 420 generates a high blocking signal 411.

In an embodiment, once the control voltage 401 reaches to an appropriate level, as the bandgap begins to approach a final stable state, the transistor M5 starts conducting. In an embodiment, relatively small current $I_{REF}$ from the transistor M5 to M3 is mirrored as a current $I_{OUT}$ from the drain of the transistor M4. In an embodiment, the mirrored current $I_{OUT}$ may be a very low current, for example about 6 nano-amp. When the supply voltage $V_{dd}$ rises sufficiently, the current $I_{OUT}$ is at a known, temperature-independent, and a regulated level. The current $I_{OUT}$ starts charging the capacitor C4. In an embodiment, the size of the capacitor C4 determines accurately the time it takes for the delayed regulator voltage 402 to reach a voltage very close to $V_{REG}$ of the regulator voltage 403. In an embodiment of the invention, the size of the capacitor C4 is determined based on the time required for the regulator voltage $V_{REG}$ and the bandgap voltage to stabilize. Once the delayed regulator voltage 402 reaches the $V_{REG}$ of the regulator voltage 403, the comparator 420 generates a low blocking signal 411.

In an embodiment of the invention, the comparator 420 can be designed to have an offset voltage in the differential input level. The comparator offset voltage represents the minimum direct current (DC) input voltage that would have to be applied to input terminals of the comparator to cause the comparator to transition state. Here, the offset voltage guarantees that the blocking signal 411 goes to a low state once the delayed regulator voltage 402 reaches within an acceptable range of $V_{REG}$. The offset voltage of the comparator 420 can be configured using an integral-ratioed asymmetry in the op-amp differential input transistor pair, or by other known techniques in the art. For example, in case the POR circuit 200 is used in an RFID system, the comparator 420 could be modified to generate a low blocking signal 411 when the delayed regulator voltage 402 is within 20-50 mV of the $V_{REG}$.

The circuit 400 discussed above, compares a delayed replica of the regulator voltage with the regulator voltage $V_{REG}$ to ensure its stability before allowing for the de-assertion of the PoR circuit. However, initially, both the delayed regulator voltage 402 and the regulator voltage 403 are close to a ground level. Under these circumstances, the comparator 420 recognizes the voltage levels of the two signals are very close and generates a low blocking signal 411. Consequently, the circuit 400 may wrongfully allow the de-assertion of the reset state. To prevent the de-assertion when the regulator voltage is close to a ground level, the circuit 500 is used.

Referring to FIG. 5, the circuit 500 blocks de-assertion of the reset state when the regulator voltage $V_{REG}$ is too low. The circuit 500 comprises of four transistors M6, M7, M8, and M9; a series of resistors R1, R2, and R3; a capacitor C7; and two inverters 521 and 522. In an embodiment, the transistor M6 and M7 are PMOS transistors. In an embodiment, the transistors M6 and M7 form a current mirror in the following configuration: gates of the transistors M6 and M7 are coupled together, sources of the transistors M6 and M7 are coupled to the source voltage $V_{dd}$. In an embodiment, the transistor M6 is matched to the transistor M7, that is, the PMOS transistors have the same characteristics. As a result of the gate coupling and matched transistor characteristics, the $V_{GS}$ of the transistor M6 is set to the $V_{GS}$ of the transistor M7, and consequently, a current flowing in the drain of the transistor M6 is the same as the current flowing in the drain of the transistor M7.

The drain of the transistor M6 is coupled to a drain of the transistor M8. A source of the transistor M8 is grounded. A gate of the transistor M8 is coupled to a control voltage 501. A control voltage is used to generate a regulated current in the bandgap circuit. The control voltage is initially at zero but it increases as the system powers up. Similarly, a drain of the transistor M9 is coupled to the drain of transistor M7. A source of the transistor M9 is grounded. A gate of the transistor M9 receives a divided regulator voltage 502. In an embodiment, the divided regulator voltage 502 is generated by a voltage divider 520. In an embodiment, the voltage divider 520 is formed by a series of resistors R1, R2, and R3 coupled between a regulator voltage $V_{REG}$ and a ground voltage. In an embodiment, more than three resistors may be used. In an embodiment, the blocking signal 511 is generated on a node YY after going through two inverters 522 and 521. The node YY is the terminal connecting the drain of the transistor M7 to the drain of the transistor M9. The capacitor C7 is coupled between the source voltage $V_{dd}$ and the node YY.

Referring to FIG. 5, as the voltage source $V_{dd}$ increases the capacitor C7 ensures that the voltage of the node YY also increases. Also as the voltage source $V_{dd}$ rises the control voltage 501 increases. The control voltage 501 turns on the transistor M8. In an embodiment, relatively small current $I_{REF}$ from the transistor M8 to M6 is mirrored as a current $I_{OUT}$ from the drain of the transistor M7 to the source of M9. In an embodiment, the mirrored current $I_{OUT}$ may be about 6 nano-amp. As such, the voltage at node YY reaches close to the source voltage $V_{dd}$. A high state of the node YY is buffered by the inverters 522 and 521 generating a high blocking signal 511. The high blocking signal 511 will block the de-assertion of the reset state, as long as $V_{REG}$ remains very low, close to ground.

The transistor M9 is controlled by signal 502 of the voltage divider 520. While the regulator voltage $V_{REG}$ is low, M9 is off. Once a ratio of the regulator voltage $V_{REG}$ set by the voltage divider 520 reaches the conduction threshold of the transistor M9, the M9 transistor begins conducting. In an embodiment, once the M9 starts conducting, the current in M9 will become much greater than the small regulated current $I_{OUT}$. Subsequently the voltage on the node YY will be pulled to the ground level. In an embodiment, two third of $V_{REF}$ is required to reach the conduction threshold of the transistor M9. The low state of the node YY is buffered by the inverters 522 and 521, generating a low blocking signal 511. The low blocking signal ceases blocking the de-assertion of the PoR circuit.

Figure 6:
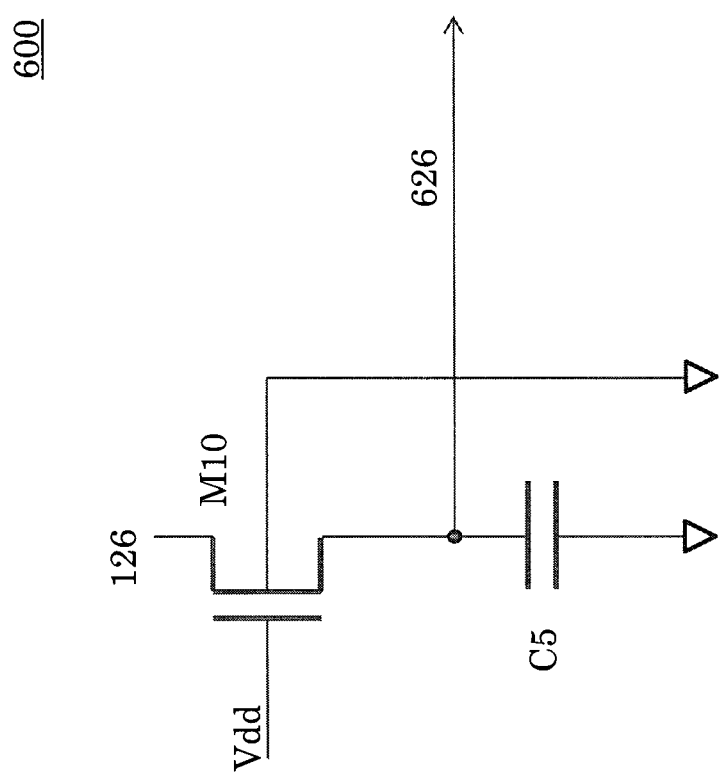
FIG. 6 illustrates a circuit for generating a stored version of the regulator voltage according to one embodiment of the present invention.

Referring to FIG. 6, the circuit 400 generates a stored version of the second reference voltage 126 of FIG. 1 for the comparator 122. In an embodiment of the invention, as discussed above, the bandgap voltage is used to generate regulator voltage. The reference voltages are proportional to the regulator voltage. The bandgap voltage is advantageously capable of operating with a low power supply potential. In an embodiment, the comparator 122 compares the supply voltage 125 to the second reference voltage 126. Once the supply voltage 125 falls below the second reference voltage 126, the comparator 122 generates a low re-assert signal 113 to re-assert the reset state.

However, in an embodiment of the invention, during the chip power down, as the supply voltage $V_{dd}$ falls, the bandgap voltage also declines. The behavior of the bandgap voltage depends upon variations in process, temperature and ramp-down rate of $V_{dd}$. In an embodiment, the bandgap voltage may start to fail at a nearby $V_{dd}$ level and the second reference voltage 126 may rapidly decline well below $V_{dd}$. As such, the supply voltage 125 may never drop below the second reference voltage 126 for the re-assertion to occur.

Referring to FIG. 6, the circuit 600 generates a stored version of the second reference voltage 126, a stored reference voltage 626, for the comparator 204 of FIG. 2. In an embodiment of the invention, the circuit 600 comprises of an NMOS transistor M10 and a capacitor C5. A drain of the transistor M10 is coupled to the second reference voltage 126, a source of the transistor M10 is coupled to the capacitor C5, a bulk terminal of the transistor M10 is grounded, and a gate of the transistor M10 is coupled to the supply voltage $V_{dd}$. The stored reference voltage 626 is generated at a node coupling the capacitor C5 to the source of the transistor M10. The other terminal of the capacitor C5 is grounded.

In an embodiment of the invention, while the system is powered up and the supply voltage $V_{dd}$ exceeds the threshold for de-assertion of the PoR signal, the transistor M10 is turned on, Consequently, the capacitor C5 is charged through the transistor M10 to the same voltage level as the second reference voltage 126. In an embodiment, as the chip is powered down and $V_{dd}$ falls close to the second reference voltage 126, the transistor M10 conducts at a very low rate. However, because of the charged capacitor C5, the voltage level of the stored reference voltage 626 will remain unchanged in the time scale of chip power down. When the supply voltage 125 of the FIG. 2 falls below the stored reference voltage 626, the comparator 122 will flip the latch 110 to re-assert the reset state.

In an embodiment of the invention, the comparator 122 can be designed to have an offset voltage in the differential input level. The comparator offset voltage represents the minimum direct current (DC) input voltage that would have to be applied to input terminals of the comparator to cause the comparator to transition state. The offset voltage of the comparator 122 can be configured using an integral-ratioed asymmetry in the op amp differential input transistor pair, or by other known techniques in the art. In an embodiment, the comparator 122 could be configured to push a re-assertion voltage at a voltage level lower than the stored reference voltage 626. For example, in case the POR circuit 200 is used in an RFID system, the comparator 122 could be modified to push the re-assertion voltage when the supply voltage 125 is within 20-50 mV below the stored reference voltage 626. In an embodiment, the reassertion voltage is pushed when the supply voltage 125 is around 0.7V or slightly lower.

The POR circuit 200 described above could be used to perform other functionalities in a chip. The circuit can determine when the supply voltage $V_{dd}$ is greater than a reference voltage and when it falls below certain other reference voltage. In an embodiment of the invention, as explained above, a first comparator compares the supply voltage $V_{dd}$ to three times the bandgap voltage $V_{BG}$, and a second comparator compares the supply voltage $V_{dd}$ to twice the bandgap voltage $V_{BG}$. In an embodiment, the reference voltage can be modified to set different threshold. For example, various circuits within a chip that may not be reliable at some voltage levels can be disabled to prevent incorrect operations.

In an embodiment of the invention, to adjust the level of reference voltage input to the comparators, a series of resistors are used. In an embodiment, an accurate adjustment is possible by drawing a known current from the voltage regulator through a known resistor to provide the reference voltage inputted to the comparators. The current may be mirrored in some ratio from a known regulated current from a bandgap circuit or other reference voltage circuits. The resistors may match those resistors in a bandgap circuit as well. Thus, while the absolute value of the resistor may vary, the voltage product of the current through the resistor, being used for the adjustment, will be as accurate as the reference voltage. In an embodiment, the resistors can be segmented to allow a wide range of voltage adjustment of the comparator input by tapping off any node between resistor segments desired.

Figure 7:
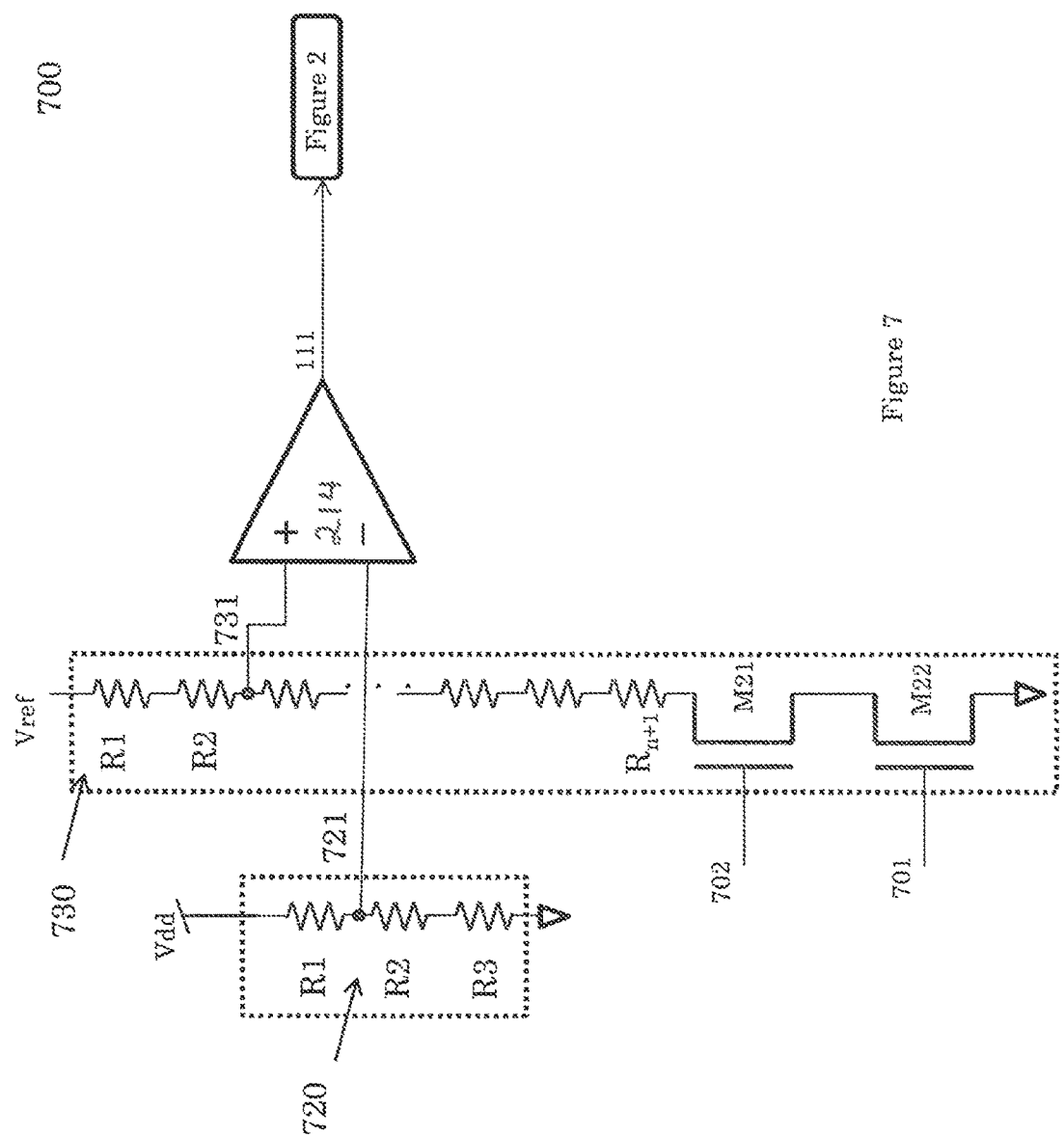
FIG. 7 illustrates a circuit for changing the voltage of the first reference voltage after the de-assertion of the reset state according to one embodiment of the present invention.

Referring to FIG. 7, a schematic of circuit generating inputs for the comparator 214 of the FIG. 2 is shown. In an embodiment, the circuit 700 comprises of the voltage divider 720 generating input signal 721 to an inverting terminal of the comparator 214 and the circuit 730 generating a reference signal 731 to a non-inverting terminal of the comparator 214. In an embodiment the voltage divider 720 comprises of a plurality of resistors. For example, the voltage divider 720 comprises of resistors R1, R2, and R3. In an embodiment, the resistors R1, R2, and R3 have a same resistance. In an embodiment, depending on which terminal of the voltage divider 720 the comparator 214 is coupled to, a different ratio of the supply voltage $V_{dd}$ is generated. For example, referring to FIG. 7, the input signal 721 has two third voltage of the supply voltage $V_{dd}$.

In an embodiment of the invention, circuit 730 may be configured to adjust a reference voltage 731 to a non-inverting terminal of the comparator 214. The circuit 730 comprises of a plurality of resistors (R1, R2, . . . , Rn) coupled in series with two transistors M21 and M22 between the reference voltage $V_{REF}$ and ground. A gate of the transistor M21 is coupled to an enabling signal 702. A gate of the transistor M22 is coupled to the control voltage 710. The circuit 730 generates a reference signal 731. The non-inverting terminal of the comparator 214 is coupled to one of the terminals between the resistors R1 through Rn. In an embodiment, the voltage on the reference signal 731 depends upon which terminal between the two resistors in series of resistors R1 through Rn the comparator 214 is coupled to.

In an embodiment of the invention, when the enabling signal 702 is set to a ground level, the comparator 214 functions the same as previously described with respect to the comparator 121 of FIG. 1. The series of resistors R1 through Rn pull the non-inverting terminal of the comparator 214 up to the voltage reference $V_{REF}$. Subsequently, the de-assertion could take place according to the procedure explained above. However, once the de-assertion of the reset state is enforced, the enabling signal 702 could turn on the transistor M21. At the same time, the control voltage is pushing a known current through the transistor M22. The current will go through certain number of resistors R1 through Rn, forcing the reference signal 731 to be lower than the reference voltage $V_{REF}$. In an embodiment, the increase in the output of the comparator 214 will not impact the behavior of the POR circuit 200 since the de-assertion has already taken place.

In an embodiment of the invention, other chip logic of the system can be sensing a logic high voltage in an output signal 111. In an embodiment, other sensitive circuitry in the chip, which might operate improperly at or below the voltage sensed by the circuit 700, may be disabled. For example, a non-volatile memory may operate well at 0.85 V; however, its write functionality can be corrupted at or below 0.8 V. Referring to FIG. 7, the output signal 111 of the comparator 214 will go to a high state (very close to $V_{dd}$) when the input signal 721 is below the reference signal 731. On the other hand, the output signal 111 of the comparator 214 will go to a low state (very close to the ground) when the input signal 721 is above the reference signal 731. For example, in an embodiment of FIG. 7, the comparator 214 will send a disabling high output signal 111 if:

$$(\tfrac{2}{3}\ V_{dd}) < (V_{ref}(I_{M22} \times (R_1 + R_2 + \ldots + R_j)))$$

Where the non-inverting input of comparator 214 is connected to the circuit 730 between $R_n$ and $R_{n+1}$ and $I_{M22}$ is the current going through the transistor M22. As such, the series resistors R1 through $R_{n+1}$ allow the adjustment of the reference signal 731. In an embodiment, an analog mux may be placed between the terminals and the non-inverting terminal of the comparator 214. Subsequently, the adjustment to the reference signal 731 could be made using control circuitry.

Figure 8:
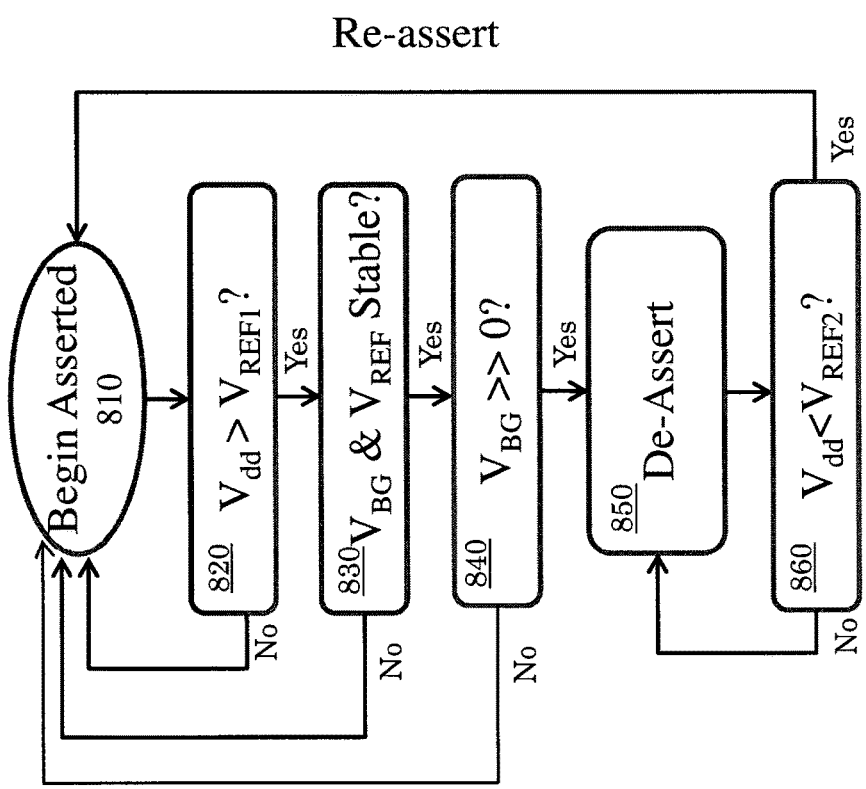
FIG. 8 illustrates a flow diagram of the operation of the POR circuit according to one embodiment of the present invention.

FIG. 8 is a flow chart explaining the operation of the POR circuit in accordance with one embodiment of the invention. The POR circuit begins its operation at step 810 by having the system in an asserted state. In an embodiment, the system remains in an asserted state until the conditions for de-assertion are met. In an embodiment, any appropriate startup circuit may be used to generate signals placing the system initially in an asserted state. In an embodiment, the circuit of FIG. 3 explained above is used to initiate the POR circuit in an asserted state.

At step 820 of the flow chart 800, the POR circuit determines whether the supply voltage $V_{dd}$ is above a threshold level for a safe de-assertion of the system. In an embodiment, the threshold level is defined by a first reference voltage $V_{REF1}$. In an embodiment, the $V_{REF1}$ is generated by voltage regulators based on a bandgap voltage $V_{BG}$. In an embodiment, any appropriate circuit may be used to compare the reference voltage $V_{REF1}$ to the supply voltage $V_{dd}$. In an embodiment, a first comparator of FIG. 2 is used to compare $V_{REF1}$ to $V_{dd}$. If the supply voltage $V_{dd}$ is above the threshold set by the first reference voltage $V_{REF1}$ the step 830 is implemented, otherwise the POR circuit will remain asserted until the conditions are met.

At step 830 of the flow chart 800, the POR circuit determines whether the bandgap voltage $V_{BG}$ and regulator voltage $V_{REG}$ are in a stable state. In an embodiment, the regulator voltage $V_{REG}$ is generated by a voltage regulator based on the bandgap voltage $V_{BG}$. In an embodiment, to determine whether regulator voltage $V_{REG}$ is stabilized, a delayed version of the $V_{REG}$ is compared to the $V_{REG}$. If the voltages are substantially the same, the regulator voltage has stabilized. Any appropriate circuitry can be used to generate a delayed version of the regulator voltage and to compare the delayed regulator voltage to the regulator voltage. In an embodiment, the circuit of FIG. 4 is used to generate a delay version of $V_{REG}$ and to compare it to the $V_{REG}$. If the bandgap voltage $V_{BG}$ and the regulator voltage $V_{REG}$ have stabilized the step 840 of the flow chart 800 is implemented, otherwise the POR circuit will remain asserted until the conditions are met.

At step 840 of the flow chart 800, the POR circuit determines whether the regulator voltage $V_{REG}$ is too low. At step 830, a delayed version of the regulator voltage $V_{REG}$ is compared to $V_{REG}$. However, if $V_{REG}$ is initially close to the ground level, the step 830 will fail. As such, step 830 ensures $V_{REG}$ is at a certain voltage for a safe de-assertion. Any appropriate circuitry can be used to determine whether $V_{REG}$ is at a low voltage level. In an embodiment, the circuit of FIG. 5 is used to determine whether a fraction of $V_{REG}$ is at a conduction voltage level of a transistor. If the $V_{REG}$ is higher than the required threshold, the step 850 of the flow chart 800 is implemented, otherwise the POR circuit will remain asserted until the conditions are met.

At step 850 of the flow chart 800, the FOR circuit finally de-asserts the reset state. In an embodiment of the invention, the system will remain in the de-assertion state until a condition for re-assertion is met. As illustrated in FIG. 8, the POR circuit loops between the step 850 and 860 until the re-assertion condition is met.

At step 860 of the flow chart 800, the FOR circuit determines whether conditions for re-assertion are met. In an embodiment, when the supply voltage $V_{dd}$ falls below a threshold level the system malfunctions. To avoid malfunctioning of the system, a re-assertion of the reset state is enforced when the supply voltage drop below the voltage of a second reference voltage $V_{REF2}$. In an embodiment, a second comparator of FIG. 2 is used to compare $V_{REF2}$ to $V_{dd}$. If the supply voltage $V_{dd}$ is below the threshold set by the second reference voltage $V_{REF2}$ the FOR re-asserts the reset state and returns to step 810, otherwise the system will remain in a de-asserted state. In an embodiment, $V_{REF2}$ may follow $V_{dd}$ as the system powers down. In an embodiment, a stored version of $V_{REF2}$ is used to compare with $V_{dd}$. Any appropriate circuit may be used to generate a stored version of $V_{REF2}$. In an embodiment, the circuit of FIG. 6 is used to generate a stored version of $V_{REF2}$.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a power-on reset circuit that generates a reset signal, including a first comparator having a first input terminal, a second input terminal, and an output terminal, the first input terminal coupled to a first reference voltage, and the second input terminal coupled to a supply voltage; a second comparator having a first input terminal, a second input terminal, and an output terminal, the first input terminal coupled to the supply voltage, and the second input terminal coupled to a second reference voltage; and a latch circuit having a first terminal, a second terminal, and an output, wherein the output terminal of the first comparator is coupled to the first terminal, the output terminal of the second comparator is coupled to the second terminal, and the output of the latch circuit is configured to generate a de-assert signal to de-assert a reset state in response to the supply voltage increasing above the first reference voltage and is configured to generate a re-assert signal to re-assert the reset state in response to the supply voltage dropping below the second reference voltage.

An embodiment of the invention may include a power-on reset circuit, wherein the first reference voltage is greater than the second reference voltage.

An embodiment of the invention may include a power-on reset circuit wherein, the first reference voltage and the second reference voltage are proportional to a regulator voltage and the regulator voltage is generated based on a bandgap voltage.

An embodiment of the invention may include a power-on reset circuit, wherein prior to the latch circuit generating the de-assert signal the reset state is asserted.

An embodiment of the invention may include a power-on reset circuit further comprising a capacitor coupled between the supply voltage and the first terminal of the latch circuit.

An embodiment of the invention may include a power-on reset circuit further comprising a startup circuit, including a first capacitor coupled between the supply voltage and a first transistor: the first transistor having a drain coupled to the first capacitor, a source being grounded, and a gate coupled to a bandgap voltage; a second transistor having a drain coupled to the first terminal of the latch circuit, a source being grounded, and a gate coupled to the source of the first transistor; and a second capacitor coupled between the first terminal of the latch circuit and the ground.

An embodiment of the invention may include a power-on reset circuit, wherein the de-assert signal is configured to be delayed until the regulator voltage is stabilized.

An embodiment of the invention may include a power-on reset circuit, wherein a delayed version of the regulator voltage is compared to the regulator voltage.

An embodiment of the invention may include a power-on reset circuit further comprising a first de-assert blocking circuit, including a first transistor having a source coupled to the regulator voltage, a gate coupled to a gate of the second transistor, and a drain coupled to the gate and a third transistor; a second transistor having a source coupled to the regulator voltage, a gate coupled to the gate of the first transistor, and a drain coupled to a capacitor; a third transistor having a drain coupled to the drain of the first transistor, a source being grounded, and a gate coupled to a control voltage; a capacitor coupled between the drain of the second transistor and a ground; and a comparator having a non-inverting terminal coupled to the regulator voltage and an inverting terminal coupled to the drain of the second transistor.

An embodiment of the invention may include a power-on reset circuit, wherein a size of the capacitor determine a delay time for generating the delayed version of the regulator voltage.

An embodiment of the invention may include a power-on reset circuit, wherein the de-assert signal is configured to be delayed until the regulator voltage is stabilized.

An embodiment of the invention may include a power-on reset circuit, wherein the de-assert signal is configured to be delayed until the regulator voltage is substantially above a ground voltage.

An embodiment of the invention may include a power-on reset circuit further comprises a second de-assert blocking circuit, including a first transistor having a source coupled to the supply voltage, a gate coupled to a gate of the second transistor, and a drain coupled to the gate and a third transistor; a second transistor having a source coupled to the supply voltage, a gate coupled to the gate of the first transistor, and a drain coupled to a fourth transistor; a third transistor having a drain coupled to the source of the first transistor, a source being grounded, and a gate coupled to a control voltage; a fourth transistor having a drain coupled to the drain of the second transistor, a source being grounded, and a gate coupled to a voltage divider; the voltage divider coupled to the regulator voltage and a ground; a capacitor coupled between the power supply and the drain of the second transistor; and an output signal generated at a terminal coupling the drain of the second transistor and the source of the fourth transistor.

An embodiment of the invention may include a power-on reset circuit, wherein the voltage divider defines a range for the regulator voltage above the ground to allow generating the de-assert signal.

An embodiment of the invention may include a power-on reset circuit, wherein the second reference voltage is a stored version of the regulator voltage.

An embodiment of the invention may include a power-on reset circuit further comprising a delay circuit, including a transistor having a drain coupled to the regulator voltage, a gate coupled to the supply voltage, and a source coupled to a capacitor, wherein the second input terminal of the second comparator is coupled to the source of the transistor.

An embodiment of the invention may include a power-on reset circuit, wherein after the generating of the de-assert signal the first reference signal is changed to a different voltage level.

An embodiment of the invention may include a power-on reset circuit further including a series of resistors coupled between the regulator voltage and a first transistor; the first transistor having a drain connected to the series of resistors, a source coupled to second transistor, and a gate coupled to an enabling signal; the second transistor having a drain coupled to the source of the first transistor, a gate coupled to the bandgap voltage, and a source being grounded, wherein the first input terminal of the first comparator is coupled to a terminal between the series of resistors.

An embodiment of the invention may include a method of generating a power-on reset signal including a means for comparing a first reference voltage and a supply voltage; a means for comparing a second reference voltage and the supply voltage; a means for generating a de-assert signal to de-assert a reset state in response to the supply voltage increasing above the first reference voltage; and a means for generating a re-assert signal to re-assert the reset state in response to the supply voltage dropping below the second reference voltage.

An embodiment of the invention may include a method of generating a power-on reset signal, wherein the first reference voltage is greater than the second referenced voltage.

An embodiment of the invention may include a method of generating a power-on reset signal, wherein before generating the de-assert signal the power-on reset signal asserts the reset state.

An embodiment of the invention may include a method of generating a power-on reset signal further comprises a means for delaying the de-assert signal until the bandgap voltage is stabilized.

An embodiment of the invention may include a method of generating a power-on reset signal further comprises a means for blocking the de-assert signal when the bandgap voltage is substantially at a ground level.

An embodiment of the invention may include a method of generating a power-on reset signal, wherein the second reference voltage is a stored multiple of a bandgap voltage.

What is claimed is:

1. A power-on reset circuit that generates a reset signal having an asserted state and a de-asserted state, comprising:
   a first comparator having a first input terminal of the first comparator, a second input terminal of the first comparator, and an output terminal of the first comparator, the first input terminal of the first comparator coupled to a first reference voltage, and the second input terminal of the first comparator coupled to a supply voltage;
   a second comparator having a first input terminal of the second comparator, a second input terminal of the second comparator, and an output terminal of the second comparator, the first input terminal of the second comparator coupled to the supply voltage, and the second input terminal of the second comparator coupled to a second reference voltage, which is different than the first reference voltage;
   a latch circuit having a first terminal of the latch circuit, a second terminal of the latch circuit, and an output of the latch circuit, wherein the output terminal of the first comparator is coupled to the first terminal of the latch circuit, the output terminal of the second comparator is coupled to the second terminal of the latch circuit, and the output of the latch circuit is configured to generate the reset signal having the de-asserted state in response to the supply voltage increasing above the first reference voltage and is configured to generate the reset signal having the asserted state in response to the supply voltage dropping below the second reference voltage; and
   a storage circuit coupled to the second input terminal of the second comparator, the storage circuit storing the second reference voltage.

2. The power-on reset circuit of claim 1, wherein the first reference voltage is greater than the second reference voltage.

3. The power-on reset circuit of claim 2, wherein the first reference voltage and the second reference voltage are proportional to a regulator voltage and the regulator voltage is generated based on a bandgap voltage.

4. The power-on reset circuit of claim 1, wherein prior to the latch circuit generating the reset signal having the de-asserted state, the reset signal has the asserted state.

5. The power-on reset circuit of claim 4 further comprising a capacitor coupled between the supply voltage and the first terminal of the latch circuit.

6. The power-on reset circuit of claim 5 further comprising a startup circuit, the startup circuit comprising:
   a first capacitor coupled between the supply voltage and a first transistor;
   the first transistor having a drain coupled to the first capacitor, a source being coupled to ground, and a gate coupled to a control voltage;
   a second transistor having a drain coupled to the first terminal of the latch circuit, a source being coupled to ground, and a gate coupled to the source of the first transistor; and
   a second capacitor coupled between the first terminal of the latch circuit and the ground.

7. The power-on reset circuit of claim 3, wherein the reset signal having the de-asserted state is configured to be delayed until the regulator voltage is stabilized.

8. The power-on reset circuit of claim 7, wherein a delayed version of the regulator voltage is compared to the regulator voltage.

9. The power-on reset circuit of claim 8 further comprising a first de-assert blocking circuit, the first de-assert blocking circuit comprising:
   a first transistor coupled to the regulator voltage;
   a second transistor having a source of the second transistor coupled to the regulator voltage, a gate of the second transistor coupled to a gate of the first transistor, and a drain of the second transistor coupled to a capacitor;
   a third transistor coupled to of the first transistor, a source of the third transistor coupled to ground;
   the capacitor coupled between the drain of the second transistor and the ground; and
   a comparator having a non-inverting terminal coupled to the regulator voltage and an inverting terminal coupled to the drain of the second transistor.

10. The power-on reset circuit of claim 9 wherein a size of the capacitor determines a delay time for generating the delayed version of the regulator voltage.

11. The power-on reset circuit of claim 3, wherein the reset signal having the de-asserted state is configured to be delayed until the regulator voltage is stabilized.

12. The power-on reset circuit of claim 3, wherein the reset signal having the de-asserted state is configured to be delayed until the regulator voltage is substantially above a ground voltage.

13. The power-on reset circuit of claim 12 further comprising a second de-assert blocking circuit, the second de-assert blocking circuit comprising:
   a first transistor coupled to the supply voltage;
   a second transistor having a source of the second transistor coupled to the supply voltage, a gate of the second transistor coupled to a gate of the first transistor, and a drain of the second transistor coupled to a fourth transistor;

a third transistor coupled to the first transistor, and a gate of the third transistor coupled to a control voltage;

the fourth transistor coupled to the second transistor, and a gate of the fourth transistor coupled to a voltage divider;

the voltage divider coupled to the regulator voltage and a ground;

a capacitor coupled between the supply voltage and the drain of the second transistor; and an output signal generated at a terminal coupling the drain of the second transistor and a source of the fourth transistor.

14. The power-on reset circuit of claim 13, wherein the voltage divider defines a range for the regulator voltage above the ground to allow generating the reset signal having the de-asserted state.

15. The power-on reset circuit of claim 3, wherein the second reference voltage is a stored version of the regulator voltage.

16. The power-on reset circuit of claim 15 wherein the storage circuit comprises:

a transistor having a drain coupled to the regulator voltage, a gate coupled to the supply voltage, and a source coupled to a capacitor, wherein the second input terminal of the second comparator is coupled to the source of the transistor.

17. The power-on reset circuit of claim 3, wherein after the generating of the reset signal having the de-asserted state the first reference signal is changed to a different voltage level.

18. The power-on reset circuit of claim 17 further comprising:

a series of resistors coupled to a first transistor;

the first transistor having a drain connected to the series of resistors, a source coupled to a second transistor, and a gate coupled to an enabling signal;

the second transistor having a drain coupled to the source of the first transistor, a gate coupled to a control voltage, and a source being grounded, wherein the first input terminal of the first comparator is coupled to a terminal between the series of resistors.

19. The power-on reset circuit of claim 1 wherein an output of the storage circuit is coupled to the second input terminal of the second comparator.

20. The power-on reset circuit of claim 19 wherein the storage circuit includes a capacitor coupled to a regulator voltage to store a delayed version of the regulator voltage.

* * * * *